United States Patent
Yamamoto

(10) Patent No.: US 8,310,890 B2
(45) Date of Patent: Nov. 13, 2012

(54) SEMICONDUCTOR MEMORY DEVICE AND METHOD OF TESTING THE SAME

(75) Inventor: Akiyoshi Yamamoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/422,978

(22) Filed: Mar. 16, 2012

(65) Prior Publication Data

US 2012/0176852 A1 Jul. 12, 2012

Related U.S. Application Data

(63) Continuation of application No. 12/656,521, filed on Feb. 2, 2010, now Pat. No. 8,174,915.

(30) Foreign Application Priority Data

Feb. 4, 2009 (JP) ................ P2009-023906

(51) Int. Cl.
 *G11C 7/00* (2006.01)
(52) U.S. Cl. ..................... 365/201; 365/233.1
(58) Field of Classification Search .................. 365/201, 365/233.1
See application file for complete search history.

(56) References Cited

U.S. PATENT DOCUMENTS

| | | | |
|---|---|---|---|
| 5,587,950 A * | 12/1996 | Sawada et al. | 365/201 |
| 5,757,705 A | 5/1998 | Manning | |
| 6,055,209 A | 4/2000 | Abo | |
| 7,151,713 B2 | 12/2006 | Nakazawa | |
| 7,414,914 B2 | 8/2008 | Nakazawa | |
| 7,635,997 B1 | 12/2009 | Samad | |

FOREIGN PATENT DOCUMENTS

| | | |
|---|---|---|
| JP | 11-25695 | 1/1999 |
| JP | 2003-346497 | 12/2003 |

\* cited by examiner

*Primary Examiner* — Son Dinh
*Assistant Examiner* — Nam Nguyen
(74) *Attorney, Agent, or Firm* — McGinn IP Law Group, PLLC

(57) ABSTRACT

A device and a method controlling the device are provided. A first command is supplied to the device in synchronization with a clock signal of a first frequency. The first command is to have the device perform a first operation. The frequency of the clock signal is changed from the first frequency to a second frequency higher than the first frequency. The device performs the first operation in synchronization with the clock signal of the second frequency following changing the frequency of the clock signal.

18 Claims, 8 Drawing Sheets

SEMICONDUCTOR MEMORY DEVICE AND METHOD OF TESTING THE SAME

This Application is a Continuation Application of U.S. patent application Ser. No. 12/656,521, having a U.S. filing date of Feb. 2, 2010, now U.S. Pat. No. 8,174,915.

BACKGROUND OF THE INVENTION

1. Field of the Invention

The present invention generally relates to a semiconductor memory device and a method of testing the same, and more particularly, to a semiconductor memory device including a test circuit measuring a time period from a first timing of input of a command signal to a second timing to allow input of the next command signal and a method of testing the same.

Priority is claimed on Japanese Patent Application No. 2009-23906, filed Feb. 4, 2009, the content of which is incorporated herein by reference.

2. Description of the Related Art

In recent years, in order to meet the demand for high-speed data write/read processes with an increase in the speed of a clock that is input from outside, semiconductor memory devices have been required to reduce the time period from the first timing of input of a command signal to the second timing to allow input of the next command signal.

In order to ensure the reliability of the semiconductor memory device, it is necessary to perform a test under conditions of a shortened time period from the first timing of input of a command signal to the second timing to allow input of the next command signal. The test will be taken place before the shipment of the semiconductor memory device.

Japanese Unexamined Patent Applications, First Publications, Nos. JP-A-2003-346497 and JP-A-11-025695 disclose semiconductor memory devices including test circuits performing the above-mentioned test.

Japanese Unexamined Patent Application, First Publication, No. JP-A-2003-346497 discloses tRCD measurement which is a measurement for the time period from the input of an ACT command to the input of a READ command or a WRITE command. The tRCD measurement is an example of the tests for measuring the characteristics of the semiconductor memory device. JP-A-2003-346497 discloses that the tRCD measurement is limited by a time margin such as an address setup time and a hold time, which is necessary to shift an address input from a row address input to a column address input. Thus, the tRCD e measurement can not he accurately performed on the basis of the characteristics of the internal circuit.

Japanese Unexamined Patent Application, First Publication, No. JP-A-2003-346497 discloses that in order to solve the above-mentioned problem, a row address is kept in the semiconductor memory device in advance before the ACT command is input so that it is not necessary to shift the address during the time period from the input of the ACT command to the input of the READ command or the WRITE command input.

Japanese Unexamined Patent Application, First Publication, No. JP-A-11-025695 discloses that a semiconductor memory device generates an internal command signal that is asynchronous with an external clock and the semiconductor memory device includes an internal circuit which is tested at a high frequency that is equal to that of the external clock on the basis of the internal command signal, without being synchronized with the external clock.

SUMMARY

In one embodiment, a method controlling a device may include the following processes. A first command is supplied to the device in synchronization with a clock signal of a first frequency. The first command is to have the device perform a first operation. The frequency of the clock signal is changed from the first frequency to a second frequency higher than the first frequency. The device performs the first operation in synchronization with the clock signal of the second frequency following changing the frequency of the clock signal.

In another embodiment, a method of controlling a semiconductor memory device including a plurality of word lines, a plurality of bit lines may include, but is not limited to, inputting a test command so that the semiconductor memory device performs a test operation mode; supplying an active command to the semiconductor memory device with a clock signal of a first frequency so that the device performs a first operation in which the semiconductor memory device activates at least one of the word lines; and changing the frequency of the clock signal from the first frequency to a second frequency higher than the first frequency. The semiconductor memory device performs the first operation in synchronization with the clock signal of the second frequency following changing the frequency of the clock signal.

In another embodiment, a device may include, but is not limited to, a memory cell array including a plurality of word lines, a plurality of bit lines, a plurality of IO lines and a plurality of switches, each of the switches being coupled between a corresponding one of the bit lines and a corresponding one of the IO lines; a control unit receiving an active and a read commands, a row and a column addresses, and a clock signal, the control unit holding the row address therein with activating at lest one of the word lines designated by the row address in response to the active command and holding the column address therein with turning on at least one of the switches designated by the column address in response to the read command in a normal operation mode, and the control unit holding the row address therein without activating the at least one of the word lines designated by the row address in response to the active command, holding the column address without turning on the at least one of the switches designated by the column address in response to the read command, activating the at least one of the word lines designated by the row address in synchronization the clock signal following the holding the column address, and turning on the at least one of the switches designated by the column address in synchronization with the clock signal following the activating the at least one of the word lines in the test operation mode.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
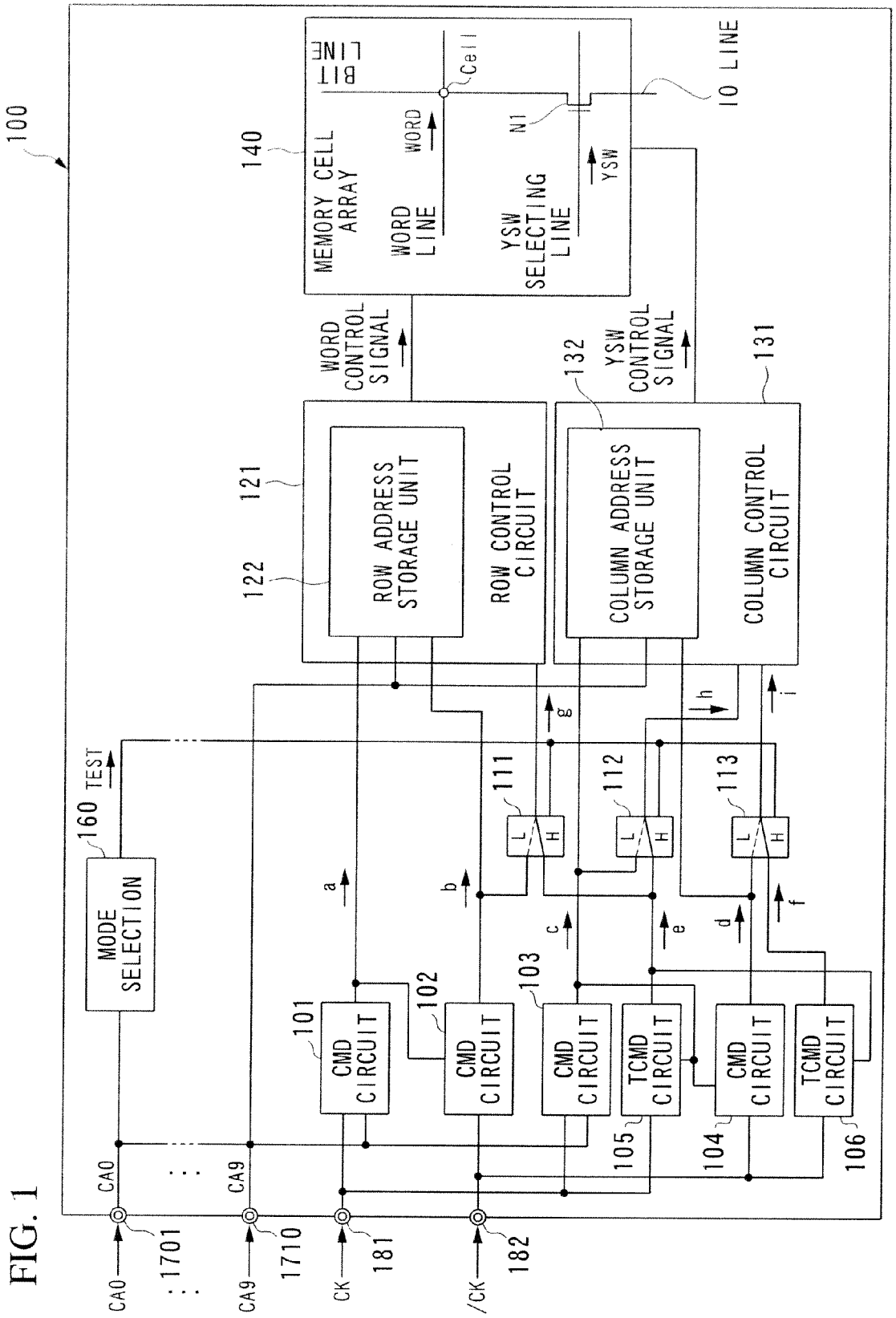
FIG. 1 is a block diagram illustrating a semiconductor memory device according to a first embodiment of the invention.

Before describing the present invention, the related art will be explained, in order to facilitate the understanding of the present invention.

In the above-mentioned semiconductor memory device, increasing the rate of an input external clock CK reduces the setup time (tS) and the hold time (tH) of a command input with respect to the external clock. In recent years, in order to reduce the number of input terminals, a semiconductor memory device has been developed so that a command and an address are input from a common CA terminal (command address input terminal) without using the command input terminal.

The semiconductor memory device receives the command input and a part of the address input from outside in synchronous with the rising edge of the external clock. The semiconductor memory device further receives the remaining address input from outside in synchronization with the falling edge of the external clock. Therefore, the increase in rate of the external clock reduces the setup and hold time margins of the command input and the address input with respect to the external clock. The reduced setup and hold time margins are less than those of the semiconductor memory device of the related art.

In the test for the semiconductor memory device in a wafer state before shipment, in order to reduce the test cost, a plurality of semiconductor memory devices is connected to one probe and is then tested. For example, a plurality of semiconductor memory devices is connected to one probe for command input.

In this case, since a plurality of semiconductor memory devices is connected to one probe, an input signal waveform is distorted. When the input signal waveform is distorted, the setup time and the hold time of the command input are reduced in the semiconductor memory device. As a result, the command is not accurately input.

In particular, this problem can he remarkable when the internal circuit is operated in synchronous with a clock of a higher frequency higher than that required in a normal operation to measure the operation margin of the internal circuit.

In order to solve the above-mentioned problems, a test method is considered which delays the synchronization of an external clock input from the outside during the test of the semiconductor memory device, as compared to the normal operation mode.

However, in the semiconductor memory device according to the related art, when the external clock is delayed, the operation of the internal circuit is also delayed. Therefore, it is difficult to perform the test under the same conditions as those in the normal operation or under the conditions more strict than those in the normal operation.

In the semiconductor memory device disclosed in JP-A-2003-346497, when the operation of the internal circuit starts actually to perform tRCD measurement, a command input is required. Therefore, it is possible to ensure the margins of the setup and hold times of an address input, but the tRCD measurement is limited by the setup and hold times of a command input. In particular, when a plurality of semiconductor memory devices is tested, it is difficult to accurately perform the tRCD measurement.

In the semiconductor memory device disclosed in JP-A-11-025695, the internal circuit is operated asynchronously with the external clock by the internal command signal. Therefore, it is difficult to accurately perform the tRCD measurement synchronized with the clock.

In the above-mentioned semiconductor memory device, increasing the rate of an input external clock CK reduces the setup time (tS) and the hold time (tH) of a command input with respect to the external clock. In recent years, in order to reduce the number of input terminals, a semiconductor memory device has been developed so that a command and an address are input from a common CA terminal (command address input terminal) without using the command input terminal.

The semiconductor memory device receives the command input and a part of the address input from outside in synchronous with the rising edge of the external clock. The semiconductor memory device further receives the remaining address input from outside in synchronization with the falling edge of the external clock. Therefore, the increase in rate of the external clock reduces the setup and hold time margins of the command input and the address input with respect to the external clock. The reduced setup and hold time margins are less than those of the semiconductor memory device of the related art.

In the test for the semiconductor memory device in a wafer state before shipment, in order to reduce the test cost, a plurality of semiconductor memory devices is connected to one probe and is then tested. For example, a plurality of semiconductor memory devices is connected to one probe for command input.

In this case, since a plurality of semiconductor memory devices is connected to one probe, an input signal waveform is distorted. When the input signal waveform is distorted, the setup time and the hold time of the command input are reduced in the semiconductor memory device. As a result, the command is not accurately input.

In particular, this problem can be remarkable when the internal circuit is operated in synchronous with a clock of a higher frequency higher than that required in a normal operation to measure the operation margin of the internal circuit.

In order to solve the above-mentioned problems, a test method is considered which delays the synchronization of an external clock input from the outside during the test he semiconductor memory device, as compared to the normal operation ode.

However, in the semiconductor memory device according to the related art, when the external clock is delayed, the operation of the internal circuit is also delayed. Therefore, it is difficult to perform the test under the same conditions as those in the normal operation or under the conditions more strict than those in the normal operation.

In the semiconductor memory device disclosed in JP-A-2003-346497, when the operation of the internal circuit starts actually to perform tRCD measurement, a command input is required. Therefore, it is possible to ensure the margins of the setup and hold times of an address input, but the tRCD measurement is limited by the setup and hold times of a command input. In particular, when a plurality of semiconductor memory devices is tested, it is difficult to accurately perform the tRCD measurement.

In the semiconductor memory device disclosed in JP-A-11-025695, the internal circuit is operated asynchronously with the external clock by the internal command signal.

Therefore, it is difficult to accurately perform the tRCD measurement synchronized with the clock.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

The invention has been made in order to solve the above-mentioned problems, and an object of the invention is to provide a semiconductor memory device capable of accurately receiving a command input and accurately performing the tRCD measurement even when a test device simultaneously measures the time from the input of a command to the input of the next command during testing of a plurality of semiconductor memory devices.

In one embodiment, a method controlling a device may include the following processes. A first command is supplied to the device in synchronization with a clock signal of a first frequency. The first command is to have the device perform a first operation. The frequency of the clock signal is changed from the first frequency to a second frequency higher than the first frequency. The device performs the first operation in synchronization with the clock signal of the second frequency following changing the frequency of the clock signal.

The first command may be supplied by supplying a set of a plurality of first addresses so as to designate a first set of a plurality of memory cells.

The first command may be supplied by supplying the first command and a part of the set of the first addresses to the device, the device receiving the first command and the part of the set in response to a first edge of the clock signal; and supplying the rest of the set of the first addresses to the device to the device, the device receiving the rest of the set in response to a second edge of the clock signal following the first edge of the clock signal.

The method may further include the following processes. A second command is supplied to the device in synchronization with the clock signal. The second command is to have the device perform a second operation. The first command is supplied and the frequency of the clock signal is changed so that the device performs a second operation in synchronization with the clock signal of the second frequency following the first operation.

The first command may be supplied by supplying a set of a plurality of first addresses so as to designate a first set of a plurality of memory cells. The second command may be supplied by supplying a set of a plurality of second addresses so as to designate a second set of the memory cells included in the first set of the memory cells.

The second command may be supplied by supplying the second command and a part of the set of the second addresses to the device with a third edge of the clock signal and supplying the rest of the set of the first addresses to the device with a fourth edge of the clock signal following the third edge of the clock signal.

In another embodiment, a method of controlling a semiconductor memory device including a plurality of word lines, a plurality of bit lines may include, but is not limited to, inputting a test command so that the semiconductor memory device performs a test operation mode; supplying an active command to the semiconductor memory device with a clock signal of a first frequency so that the device performs a first operation in which the semiconductor memory device activates at least one of the word lines; and changing the frequency of the clock signal from the first frequency to a second frequency higher than the first frequency. The semiconductor memory device performs the first operation in synchronization with the clock signal of the second frequency following changing the frequency of the clock signal.

The active command may be supplied by supplying a row address so as to designate the at least one of the word lines.

The active command may be supplied by supplying the active command and a part of the row address to the semiconductor memory device with a first edge of the clock signal; and supplying the rest of the row address to the semiconductor memory device with a second edge of the clock signal following the first edge of the clock signal.

The semiconductor device further includes a plurality of IO lines and a plurality of switches, each of the switches being coupled between a corresponding one of the bit lines and a corresponding one of the IO lines. The method may further include supplying a read command to the semiconductor device with the clock signal between supplying the active command and changing the frequency of the clock signal so that the semiconductor memory device performs a second operation in which the semiconductor memory device turns on at least one of the switches, the frequency of the clock signal being the first frequency. The semiconductor device performs the second operation in synchronization with the clock signal of the second frequency following the first operation.

The active command may be supplied by supplying a row address so as to designating the at least one of the word lines. The read command may be supplied by supplying a column address so as to designate the at least one of the switches.

The read command may he supplied by supplying the read command and a part of column address to the semiconductor memory device with a third edge of the clock signal, and supplying the rest of the column address to the semiconductor memory device with a fourth edge of the clock signal following the third edge of the clock signal.

In another embodiment, a device may include, but is not limited to, a memory cell array including a plurality of word lines, a plurality of bit lines, a plurality of IO lines and a plurality of switches, each of the switches being coupled between a corresponding one of the bit lines and a corresponding one of the IO lines; a control unit receiving an active and a read commands, a row and a column addresses, and a clock signal, the control unit holding the row address therein with activating at lest one of the word lines designated by the row address in response to the active command and holding the column address therein with turning on at least one of the switches designated by the column address in response to the read command in a normal operation mode, and the control unit holding the row address therein without activating the at least one of the word lines designated by the row address in response to the active command, holding the column address without turning on the at least one of the switches designated by the column address in response to the read command, activating the at least one of the word lines designated by the row address in synchronization with the clock signal following the holding the column address, and turning on the at least one of the switches designated by the column address in synchronization with the clock signal following the activating the at least one of the word lines in the test operation mode.

The device may further include a mode selection unit generating a test signal and supplying the test signal to the control nit so that he device performs the normal operation mode in response to a first logic level of the test signal and performs the test operation mode in response to a second logic level different from the first logic level of the test signal.

The control unit may further receive the active command and a part of the row address in response to a first edge of the clock signal and receive the rest of the row address in response a second edge of the clock signal following the first edge of the clock signal.

The control unit receives the read command and a part of the column address in response to a first edge of the clock signal and receives the rest of the column address in response to a second edge of the clock signal following the first edge of the clock signal.

The control unit may include an array control portion, a normal command decoder portion and a test command decoder portion, the normal command decoder portion supplies first, second, third and fourth timing signals to the array control portion, the test command decoder portion supplies first and second test timing signals to the array control portion, the array control portion holds the row address therein in response to the first and second timing signals and holds the column address in response to the third and fourth timing signals in the normal operation and the test operation, the array control portion activates the at least one of the word lines in response to the second timing signal and turns on the at least one of the switch in response to the fourth timing signal in the normal operation mode, and the array control portion activates the at least one of the word lines in response to the first test timing signal and turns on the at least one of the switch in response to the first and second test timing signals in the test operation mode.

The control unit further may include a selector portion receiving the second, third and fourth timing signals and the first and second test timing signals, supplying one of the second timing signal and the first test timing signal to the array control portion in response to a logic level of the test signal, supplying one of the third timing signal and the first test timing signal to the array control portion in response to the logic level of the test signal, and supplying one of the fourth timing signal and the second test timing signal to the array control portion in response to the logic level of the test signal.

The normal command decoder portion supplies the third timing signal to the test command decoder portion and the test command decoder portion generates the first test timing signal based on the third timing signal.

The device may further include a plurality of terminals receiving the active and the read commands, the row and column address, and the clock signal, and each of the plurality of terminals electrically coupled to the control unit.

First Embodiment

FIG. 1 is a block diagram illustrating a semiconductor memory device 100 according to an embodiment of the invention. In FIG. 1, the semiconductor memory device 100 includes a command decoder unit, a selector unit, an address control unit, and a memory cell array unit. The command decoder unit includes CMD circuits 101 to 104 and TCMD circuits 105 and 106. The selector unit includes selectors 111 to 113. The address control unit includes a row control circuit 121 and a column control circuit 131, and the memory cell array unit includes a memory cell array 140.

In the semiconductor memory device 100 according to this embodiment, the command decoder unit receives command address input signals CA (CA0 to CA9) input from a CA terminal (command address input terminal) (not shown) in synchronization with an external clock CK and an inverted external clock /CK, which is an inverted signal of the external clock CK. The semiconductor memory device 100 selectively operates a cell (memory cell) of the memory cell array unit having an address that is determined according to an address input, and receives or outputs data from or to the outside of the semiconductor memory device 100 through IO lines.

The semiconductor memory device 100 performs a first selecting operation (an operation of selecting a word line), which is a first operation, in response to the input of a first command (for example, an ACT command), and performs a second selecting operation (an operation of selecting a column switch), which is a second operation, in response to the input of a second command (for example, a READ command).

During the selecting operation, the semiconductor memory device 100 can set two modes, that is, a normal operation mode and a test operation mode, according to the logic level of a test signal TEST. In the two operation modes, the semiconductor memory device 100 performs a selecting operation corresponding to a command input in synchronization with the external clock.

Hereinafter, the structure of the semiconductor memory device 100 will be described in detail.

The CMD circuit 101 receives a row command, for example, an ACT command according to the logic levels of the command address input signals CA (CA0 to CA9) input from the outside through the CA terminal. In addition, the CMD circuit 101 outputs an internal command signal a, which is a one-shot pulse, in synchronization with the rising edge of the external clock CK.

The CMD circuit 102 holds the internal command signal a synchronized with the ACT command, and outputs an internal command signal b, which is a one-shot pulse synchronized with the rising edge of the inverted external clock /CK.

The CMD circuit 103 outputs an internal command signal c, which is a one-shot pulse synchronized with the rising edge of the external clock CK, according to a column command, for example, a READ command input from the outside.

The CMD circuit 104 holds the internal command signal c synchronized with the READ command, and outputs an internal command signal d, which is a one-shot pulse synchronized with the rising edge of the inverted external clock /CK.

When the internal command signal c output from the CMD circuit 103 is input, the TCMD circuit 105 is activated and outputs an internal command signal e, which is a one-shot pulse synchronized with the sing edge of the external clock CK that is initially input after the activation.

When the internal command signal e output from the TCMD circuit 105 is input, the TCMD circuit 106 is activated and outputs an internal command signal f, which is a one-shot pulse synchronized with the rising edge of the inverted external clock /CK that is initially input after the activation.

The selector 111 receives the internal command signal b and the internal command signal e and outputs one of the internal command signal b and the internal command signal e as an internal command signal g to the row control circuit 121 that is arranged in the rear stage according to the logic level of a test signal TEST for control.

The internal command signal g is for notifying the start timing of a predetermined operation corresponding to a row command input from the outside to the row control circuit 121 that is arranged in the rear stage of the selector 111.

The logic level of test signal TEST is changed in the normal operation mode and the test operation mode according to the logic level of the signal input from the outside in a mode selection circuit (not shown in FIG. 1). The test signal TEST may be input from a dedicated test terminal.

The selector 112 receives the internal command signal c and the internal command signal e and outputs one of the internal command signal c and the internal command signal e as an internal command signal h to the column control circuit 131 that is arranged in the rear stage according to the logic level of the test signal TEST.

The selector 113 receives the internal command signal d and the internal command signal f and outputs one of the internal command signal d and the internal command signal f as an internal command signal i to the column control circuit 131 that is arranged in the rear stage according to the logic level of the test signal TEST for control.

The internal command signal h and the internal command signal i are for notifying the start timing of a predetermined operation corresponding to a column command input from the outside to the column control circuit 131 that is arranged in the rear stage of the selectors.

The row control circuit 121 activates a predetermined word line corresponding to the row address input from the outside. The row control circuit 121 includes a row address storage unit 122 that stores as a row address the address input from the CA terminal according to the internal command signals a and b. The row control circuit 121 activates a WORD control signal (word line control signal) in response to the input of the one-shot pulse, which is the internal command signal g output from the selector 111.

The column control circuit 131 activates a predetermined YSW selection line corresponding to the column address input from the outside. The column control circuit 131 includes a column address storage unit 132 that stores as a column address the address input from the CA terminal according to the internal command signals c and d. The column control circuit 131 activates a YSW control signal according to the internal command signal h output from the selector 112 and the internal command signal i output from the selector 113.

Specifically, when the internal command signal i, which is a one-shot pulse, is input after the input of the internal command signal h, which is a one-shot pulse, the column control circuit 131 activates the YSW control signal.

The memory cell array 140 includes a memory cell region having a plurality of memory cells Cell arranged therein, column switches, and word and column drivers (not shown in FIG. 1).

The memory cell region includes a plurality of word lines, a plurality of hit lines, and a plurality of memory cells provided at intersections of the hit lines and the word lines. For convenience of description, FIG. 1 shows one bit line, one word line, and one memory cell Cell provided at an intersection of the hit line and the word line.

For example, when the semiconductor memory device is a DRAM, the memory cell Cell includes a capacitive element and one transistor in which a gate terminal is connected to the word line, one of a source terminal and a drain terminal is connected to the capacitive element, the other terminal of the source terminal and the drain terminal is connected to the bit line. The memory cell Cell is electrically connected to the bit line by a signal WORD output from the word driver to which the WORD control signal is input, and outputs data to the bit line.

The memory cell array 140 includes the column switch that electrically connects some of a plurality of bit lines to the external IO lines. In FIG. 1, the column switch is represented as a column switch transistor N1 in which a gate terminal is connected to a YSW selection line, one of a source terminal and a drain terminal is connected to the bit line, and the other terminal of the source terminal and the drain terminal is connected to the IO line. The column switch transistor N1 electrically connects the bit line and the IO line in response to a signal YSW output from the column decoder to which the YSW control signal is input. In this way, the selected memory cell receives or outputs data from or to the outside of the semiconductor memory device 100 through the bit line and the IO line.

Figure 2:
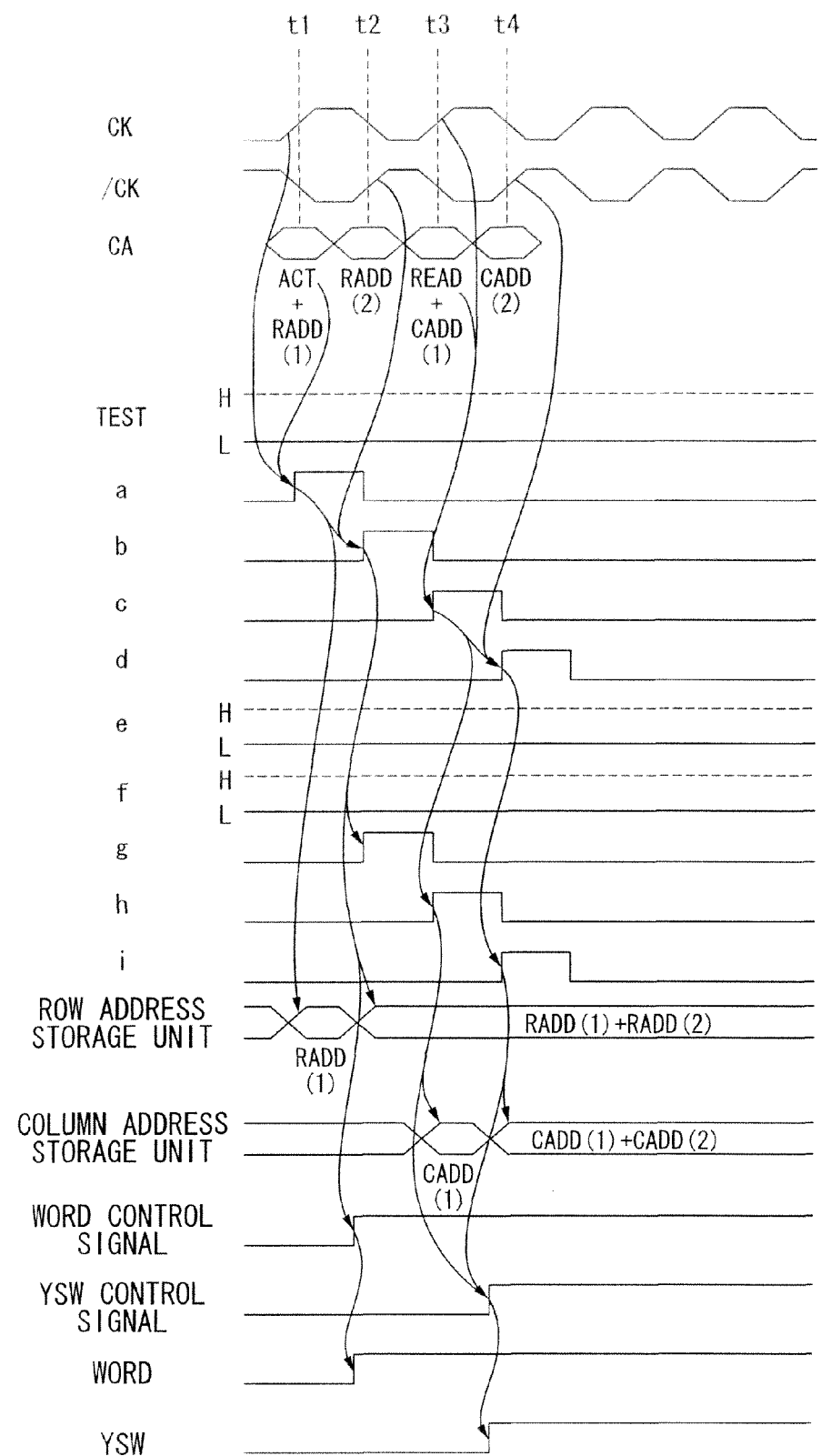
FIG. 2 is a timing chart illustrating operations of the semiconductor memory device of FIG. 1.

The operation of the semiconductor memory device 100 in the normal operation mode will be described with reference to FIG. 2. FIG. 2 is a timing chart illustrating the operation of the semiconductor memory device 100 from the input of the ACT command input to the output of the signal YSW in the normal operation mode.

At a time t1, the CMD circuit 101 receives the ACT command in synchronization with the rising edge he external clock CK input from the outside, according to the logic levels of the command address input signals CA (CA0 to CA9) input from the CA terminal, and changes the internal command signal a from a first logic level (hereinafter, referred to as an L level) to a second logic level (hereinafter, referred to as an H level). The internal command signal a is a one-shot pulse having a rising edge synchronized with the rising edge of the external clock CK.

The row address storage unit 122 in the row control circuit 121 stores the address input from the CA terminal as a row address RADD(1) according to the rising edge of the internal command signal a.

The CMD circuit 102 holds the logic level (H level) of the internal command signal a.

Then, at a time t2, the CMD circuit 102 changes the internal command signal b from the L level to the H level according to the logic level (H level) of the held internal command signal a and the logic level (H level) of the rising edge of the inverted external clock /CK. The internal command signal b is a one-shot pulse having a rising edge synchronized with the rising edge of the inverted external clock /CK.

The row address storage unit 122 in the row control circuit 121 stores the address input from the CA terminal as a row address RADD(2) according to the internal command signal b. In this way, the row address storage unit 122 latches the row address of the memory cell Cell to be selected as RADD(1)+RADD(2).

At the time t2, since the test signal TEST is at the L level, the selector 111 changes the internal command signal g from the L level to the H level with the change in the logic level of the internal command signal b. In this way, the row control circuit 121 activates the WORD control signal (word line control signal) according to the internal command signal g. The word driver in the memory cell array outputs the signal WORD that has been changed from the L level to the H level to the word line. Then, the memory cell Cell electrically connected to the bit line, and outputs the stored data to the bit line, which is not shown in FIG. 2.

At a time t3, the CMD circuit 03 receives the READ command in synchronization with the rising edge of the external clock CK input from the outside, according to the logic levels of the command address input signals CA (CA0 to CA9) input from the CA terminal, and changes the internal command signal c from the L level to the H level. The internal command signal c is a one-shot pulse having a rising edge synchronized with the rising edge of the external clock CK.

The column address storage unit 132 in the column control circuit 131 stores the address input from the CA terminal as a column address CADD(1) according to the rising edge of the internal command signal c.

The CMD circuit 104 holds the logic level (H level) of the internal command signal c.

At the time t3, since the test signal TEST is at the L level, the selector 112 changes the internal command signal h from the L level to the H level with the change in the logic level of the internal command signal c. The internal command signal h is a one-shot pulse having a rising edge synchronized with the rising edge of the internal command signal c.

At a time t4, the CMD circuit 104 changes the internal command signal d from the L level to the H level according to the logic level (H level) of the held internal command signal c and the logic level (H level) of the rising edge of the inverted external clock /CK. The internal command signal d is a one-shot pulse having a rising edge synchronized with the rising edge of the inverted external clock /CK.

The column address storage unit 132 in the column control circuit 131 stores the address input from the CA terminal as a column address CADD(2) according to the internal command signal d. I ay, the column address storage unit 132 latches the column address of the memory cell Cell to he selected as CADD(1)+CADD(2).

At the time t4, since the test signal TEST is at the L level, the selector 113 changes the internal command signal e L level to the H level with the change in the logic level of the internal command signal d. The internal command signal i is a one-shot pulse having a rising edge synchronized with the rising edge of the internal command signal d.

In this way, since the internal command signal i, which is a one-shot pulse, is input after the input of the internal command signal h, which is a one-shot pulse, the column control circuit 131 changes the YSW control signal from the L level to the H level.

The column decoder in the memory cell array receives the YSW control signal whose logic level has been changed, and outputs the signal YSW that has been changed from the L level to the H level to the YSW selection line. Then, the bit line is electrically connected to the IO line, and the column decoder outputs data stored in the memory cell Cell to the IO line, which is not shown in FIG. 2. In this way, data stored in the selected memory cell is output to the outside of the semiconductor memory device 100 through the bit line and the IO line.

Figure 3:
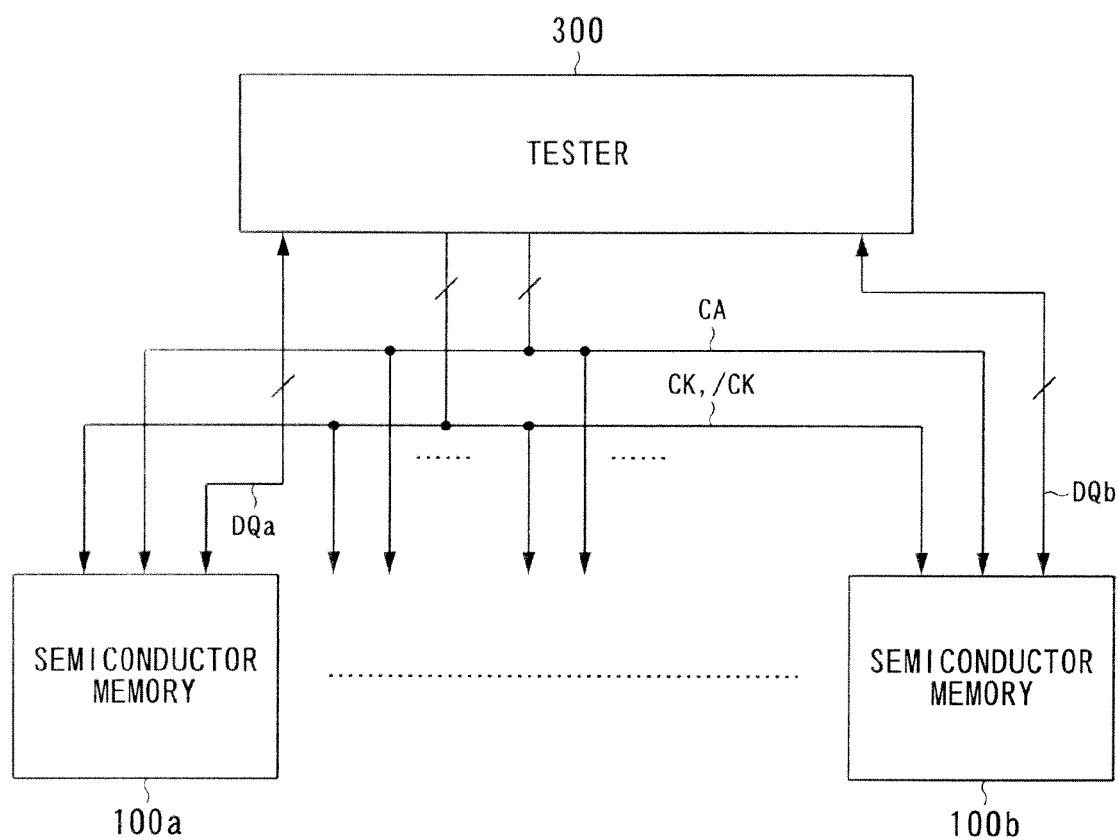
FIG. 3 is a block diagram illustrating the test structure of the semiconductor memory device of FIG. 1.
Figure 4:
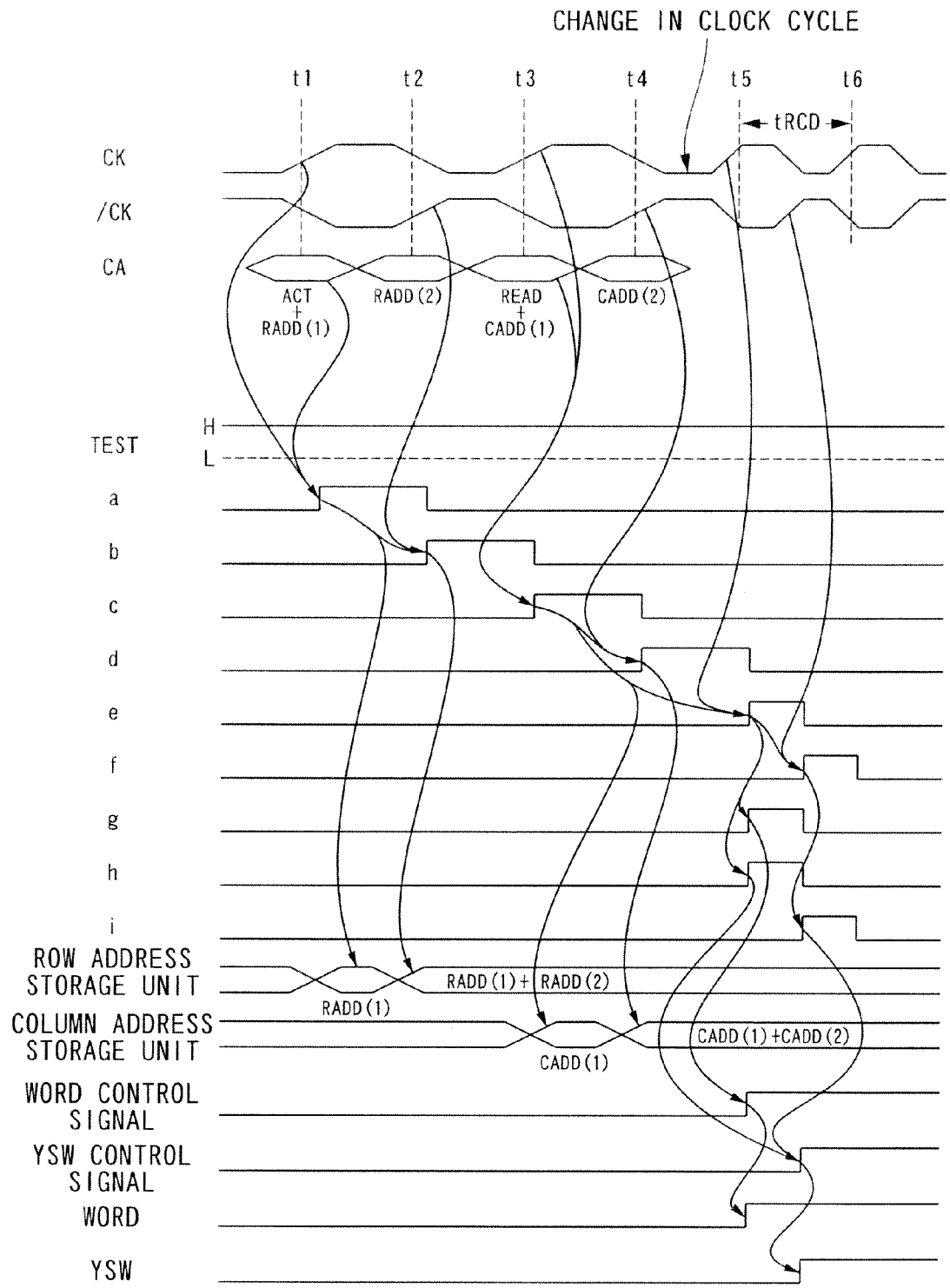
FIG. 4 is a timing chart illustrating operations of the semiconductor memory device of FIG. 1.

The operation of the semiconductor memory device 100 in the test operation mode will be described with reference to FIGS. 3 and 4. FIG. 3 is a block diagram illustrating the test structure of the semiconductor memory device 100 and shows the connection relationship between the semiconductor memory device 100 and a test device 300 used in the test operation mode. FIG. 4 is a timing chart illustrating the operation of the semiconductor memory device 100 from the input of the ACT command to the output of the signal YSW in the test operation mode.

In FIG. 3, a plurality of semiconductor memory devices 100 (in FIG. 3, a semiconductor memory device 100a and a semiconductor memory device 100b) is connected in parallel to the test device 300, and a command address input signal, an external clock, and an inverted external clock are input as the command address input signal CA, the external clock CK, and the inverted external clock /CK to both the semiconductor memory device 100a and the semiconductor memory device 100b. Data input to or output from the semiconductor memory devices is individually input or output as data DQa and DQb to or from the test device 300. The input data is input from a driver of the test device 300, and the logic level of the output data is determined by a comparator provided in the test device 300.

The test device 300 performs the setting of the input timing of each signal or input data, the generation of each signal or input data, and the determination of output data according to the program set by the user.

Therefore, the test device 300 can change the frequencies of the external clock CK and the inverted external clock /CK according to the program set by the user.

The operation of the semiconductor memory device 100 in the test operation mode will be described in detail.

At a time t1, the CMD circuit 101 receives the ACT command in synchronous with the rising edge of the external clock CK input from the outside and changes the internal command signal a from the L level to the H level. The internal command signal a is a one-shot pulse having the rising edge synchronized with the rising edge of the external clock CK.

The row address storage unit 122 in the row control circuit 121 stores the address input from the CA terminal as the row address RADD(1) according to the rising edge of the internal command signal a.

The CMD circuit 102 holds the logic level (H level) of the internal command signal a.

At a time t2, the CMD circuit 102 changes the internal command signal b from the L level to the H level according to the logic level (H level) of the held internal command signal a and the logic level (H level) of the rising edge of the inverted external clock /CK. The signal command signal b is a one-shot pulse having a rising edge synchronized with the ng edge of the inverted external clock /CK.

The row address storage unit 122 in the row control circuit 121 stores the address input from the CA terminal as the row address RADD(2) according to the internal command signal b. In this way, the row address storage unit 122 latches the row address of the memory cell Cell to be selected as RADD(1)+RADD(2).

At the time t2, since the test signal TEST is at the H level, the selector 111 maintains the internal command signal g at the same logic level as that of the internal command signal e, that is, at the L level.

At a time t3, the CMD circuit 103 receives the READ command in synchronous with the rising edge of the external clock CK input from outside, and changes the internal command signal c from the L level to the H level. The internal command signal c is a one-shot pulse having a rising edge synchronized with the rising edge of the external clock CK.

The column address storage unit 132 in the column control circuit 131 stores the address input from the CA terminal as the column address CADD(1) according to the rising edge of the internal command signal c.

The CMD circuit 104 holds the logic level (H level) of the internal command signal c.

At a time t3, since the test signal TEST is at the H level, the selector 112 maintains the internal command signal h at the same logic level as that of the internal command signal e, that is, at the L level.

At a time t4 the CMD circuit 104 changes the internal command signal d from the L level to the H level according to the logic level (H level) of the held internal command signal c and the logic level (H level) of the rising edge of the inverted external clock /CK. The internal command signal d is a one-shot pulse having a rising edge synchronized with the rising edge of the inverted external clock /CK.

The column address storage unit 132 in the column control circuit 131 stores the address input from the CA terminal as the column address CADD(2) according to the internal command signal d. In this way, the column address storage unit 132 latches the column address of the memory cell Cell to be selected as CADD(1)+CADD(2).

At the time t4, since the test signal TEST is at the H level, the selector 113 maintains the internal command signal i at the same logic level as that of the internal command signal f, that is, at the L level.

In the above-mentioned operation, in the semiconductor memory device 100, the CMD circuit 102 latches the ACT command as an H-level internal command signal a and the CMD circuit 104 latches the READ command as an H-level internal command signal c.

The row address storage unit 122 and the column address storage unit 132 latch the address RADD(1)+RADD(2) and the address CADD(1)+CADD(2), respectively, and the address of a memory cell to be selected is determined.

At that time, the test device 300 supplies the external clock CK and the inverted external clock /CK at a low frequency to the semiconductor memory devices 100a and 100b according to the program created by the user. The semiconductor memory devices 100a and 100b receive the address and command inputs with margins of the setup and hold times thereof with respect to the external clock CK and the inverted external clock /CK.

At a time t5, the test device 300 changes the frequencies of the external clock CK and the inverted external clock /CK to be higher than those at the time t4 and supplies the clocks to the semiconductor memory devices 100a and 100b.

At the time t5, since the internal command signal c is received and activated at the time t3, the TCMD circuit 105 outputs the internal command signal e, which is a one-shot pulse, in synchronization with the rising edge of the external clock CK that is initially input after the activation.

The TCMD circuit 106 receives and activates the internal command signal e.

At the time t5 since the test signal TEST is at the H level, the selector 111 changes the internal command signal g from the L level to the H level with the change in the logic level of the internal command signal e. The internal command signal g is a one-shot pulse having a rising edge that is synchronized with the rising edge of the internal command signal e. In this way, the row control circuit 121 activates the WORD control signal (word line control signal) according to the internal command signal g. The word driver in the memory cell array outputs the signal WORD that has been changed from the L level to the H level to the word line. Then, the memory cell Cell is electrically connected to the bit line, and outputs the stored data to the bit line, which is not shown in FIG. 4.

At the time t5, since the test signal TEST is at the H level, the selector 112 changes the internal command signal h from the L level to the H level with the change in the logic level of the internal command signal e. The internal command signal h is a one-shot pulse having the rising edge that is synchronized with the rising edge of the internal command signal e.

At a time t6, since the internal command signal e is received and activated at the time t5, the TCMD circuit 106 outputs the internal command signal f, which is a one-shot pulse synchronized with the rising edge of the external clock CK that is initially input after the activation.

Since the test signal TEST is at the H level, the selector 113 changes the internal command signal i from the L level to the H level with the change in the logic level of the internal command signal f. The internal command signal "i" is a one-shot pulse having a rising edge that is synchronized with the rising edge of the internal command signal f.

In this way, since the internal command signal "i", is a one-shot pulse, is input after the input of the internal command signal h, which is a one-shot pulse, the column control circuit 131 changes the YSW control signal from the L level to the H level. In FIG. 4, the period from the time t5 to the time t6, that is, the time corresponding to one period of the external clock CK corresponds to the tRCD time.

The column decoder in the memory cell array receives the YSW control signal whose logic level has been changed, and outputs the signal YSW that has been changed from the L level to the H level to the YSW selection line. Then, the bit line is electrically connected to the IO line, and the column decoder outputs data stored in the memory cell Cell to the IO line, which is not shown in FIG. 4. In this way, data stored in the selected memory cell is output to the outside of the semiconductor memory device 100 through the bit line and the IO line.

The semiconductor memory device (semiconductor memory device 100) according to this embodiment of the invention has the normal operation mode. In the normal operation mode, when the first command (ACT command) input from the outside is received, the first operation (the operation of selecting the word line) starts in synchronous with the clock signals (the external clock CK and the inverted external clock /CK) supplied from the outside. The semiconductor memory device 100 also has the test operation mode. In the test operation mode, when the first command (ACT command) input from the outside is received, the first operation (the operation of selecting the word line) does not start. When the second command (READ command) input from the outside is received after the reception of the first command (ACT command), the first operation (the operation of selecting the word line) starts in synchronous with the clock (the external clock CK and the inverted external clock /CK).

In this way, in the test operation mode, the semiconductor memory device 100 can perform an operation of determining the address of a memory cell corresponding to an address input in synchronous with the external clock. The semiconductor memory device 100 can also perform an operation of selecting a memory cell corresponding to a command input at different times of the external clock that is input in time series, in synchronous with the external clock. When the address and the command are input, the semiconductor memory device 100 can reduce the frequency of the external clock (the time t1 to the time t4) to increase the setup and hold time margins of the command address input signal CA with respect to the external clock CK and the inverted external clock /CK. During an operation corresponding to a command input, the semiconductor memory device 100 can increase the frequency of the external clock (the times t5 and t6) and can perform an internal operation in synchronous with the external clock. For example, the semiconductor memory device 100 can perform the test while strictly setting the tRCD time.

Therefore, it is possible to provide a semiconductor memory device accurately receiving a command input and accurately performing tRCD measurement even when a large number of measurements are simultaneously performed by the test device. Even when the setup and hold times of the command are reduced due to an increase in the speed of the external clock or a reduction in the number of command input pins, it is possible to perform the test corresponding to a reduction in tRCD. As a result, it is possible to improve the reliability of a semiconductor memory device.

Second Embodiment

A second embodiment of the invention will be described with reference to FIGS. 5 to 8.

Figure 5:
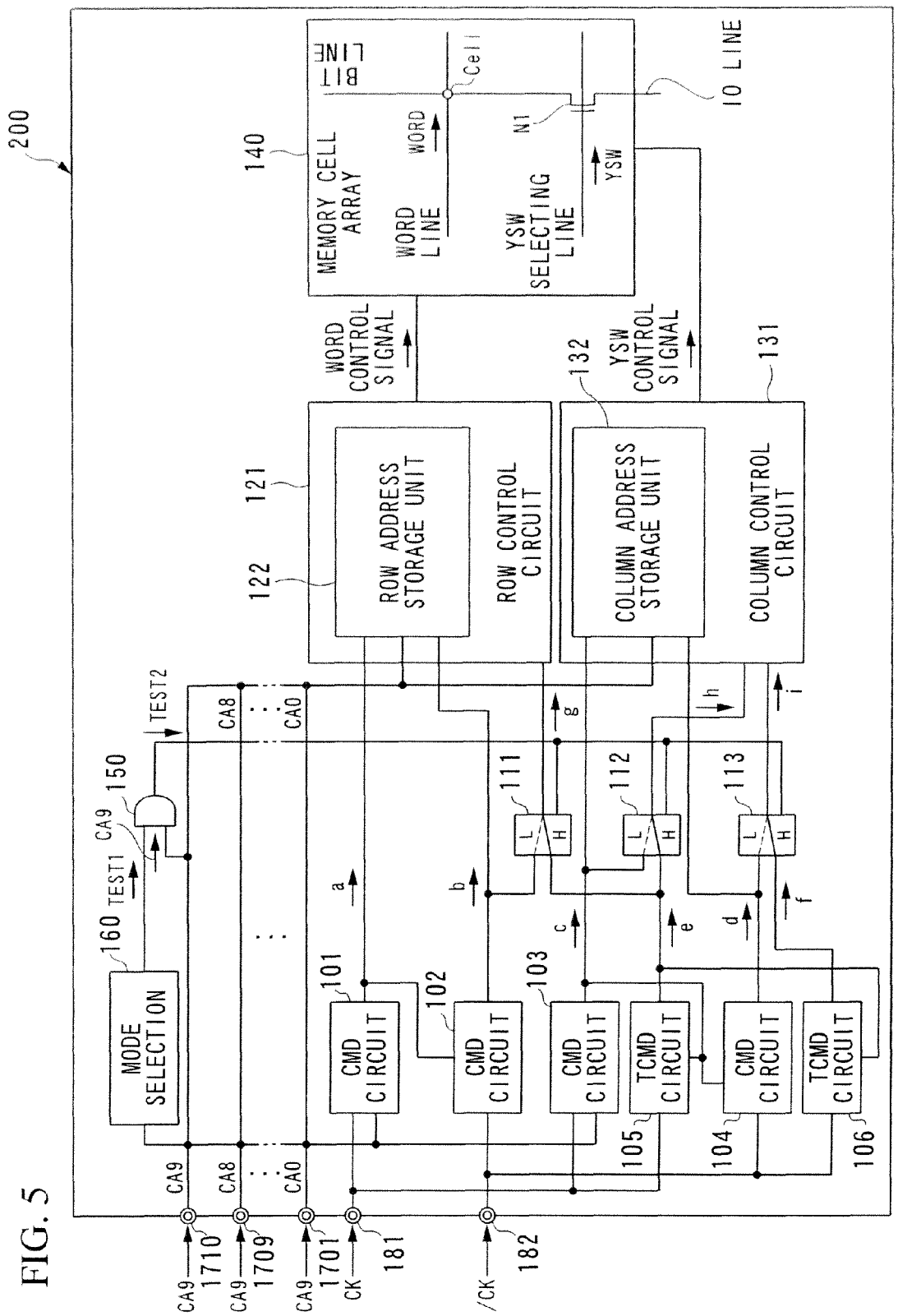
FIG. 5 is a block diagram illustrating a semiconductor memory device according to a second embodiment of the invention.

FIG. 5 is a block diagram illustrating a semiconductor memory device 200 according to the second embodiment of the invention.

In FIG. 5, for example, the same components, such as a command decoder circuit, as those shown in FIG. 1 are denoted by the same reference numerals as those shown in FIG. 1.

First, in the semiconductor memory device 200, components that are different from those shown in FIG. 1 will be described.

In FIG. 5, an AND circuit 150 outputs a test signal TEST2 to be input to the selectors 111 to 113. The AND circuit 150 is a two-input AND circuit and outputs the test signal TEST2 according to the logic levels of the input test signal TEST1 and an unused address signal CA9. The unused address signal CA9 is an address signal that is not used when the address and the command are input and is input from the outside to the semiconductor memory device 200. The command address signals CA0 to CA8 are the same as those in the first embodiment. Namely, the command address signals CA0 to CA8 are not supplied to the AND circuit 150. The command address signals CA0 to CA9 are supplied to the CMD circuits 101 and 103. The command address signals CA0 to CA9 are supplied to the mode selection circuit 160. The command address signals CA0 to CA9 are supplied to the row address storage unit 122 and the column address storage unit 132.

Similar to the test signal TEST shown in FIG. 1, for example, in the mode selection circuit, the logic level of the test signal TEST1 is changed depending on the logic level of the signal that is input from the outside in the normal operation mode and the test operation mode, which is not shown in FIG. 5. The test signal TEST1 may be input from a dedicated terminal for test.

In the semiconductor memory device 200 according to this embodiment, the command decoder unit receives the command address input signals CA (CA0 to CA9) input from a CA terminal (command address input terminal) (not shown) in synchronous with an external clock CK and an inverted external clock /CK, which is an inverted signal of the external clock CK. The semiconductor memory device 200 selectively operates a cell (memory cell) of the memory cell array unit having an address that is determined according to an address input, and receives or outputs data from or to the outside of the semiconductor memory device 200 through the IO line. During the selecting operation, the semiconductor memory device 200 can set the normal operation mode and the first and second test modes (the second test mode is referred to as a general test mode and the first test mode is referred to as an internal operation separation test mode in the following description) according to the logic levels of the test signal TEST1 and the unused address signal CA9. In the operation modes, an operation of selecting a memory cell Cell corresponding to a command input is performed in synchronous with the external clock.

Figure 6:
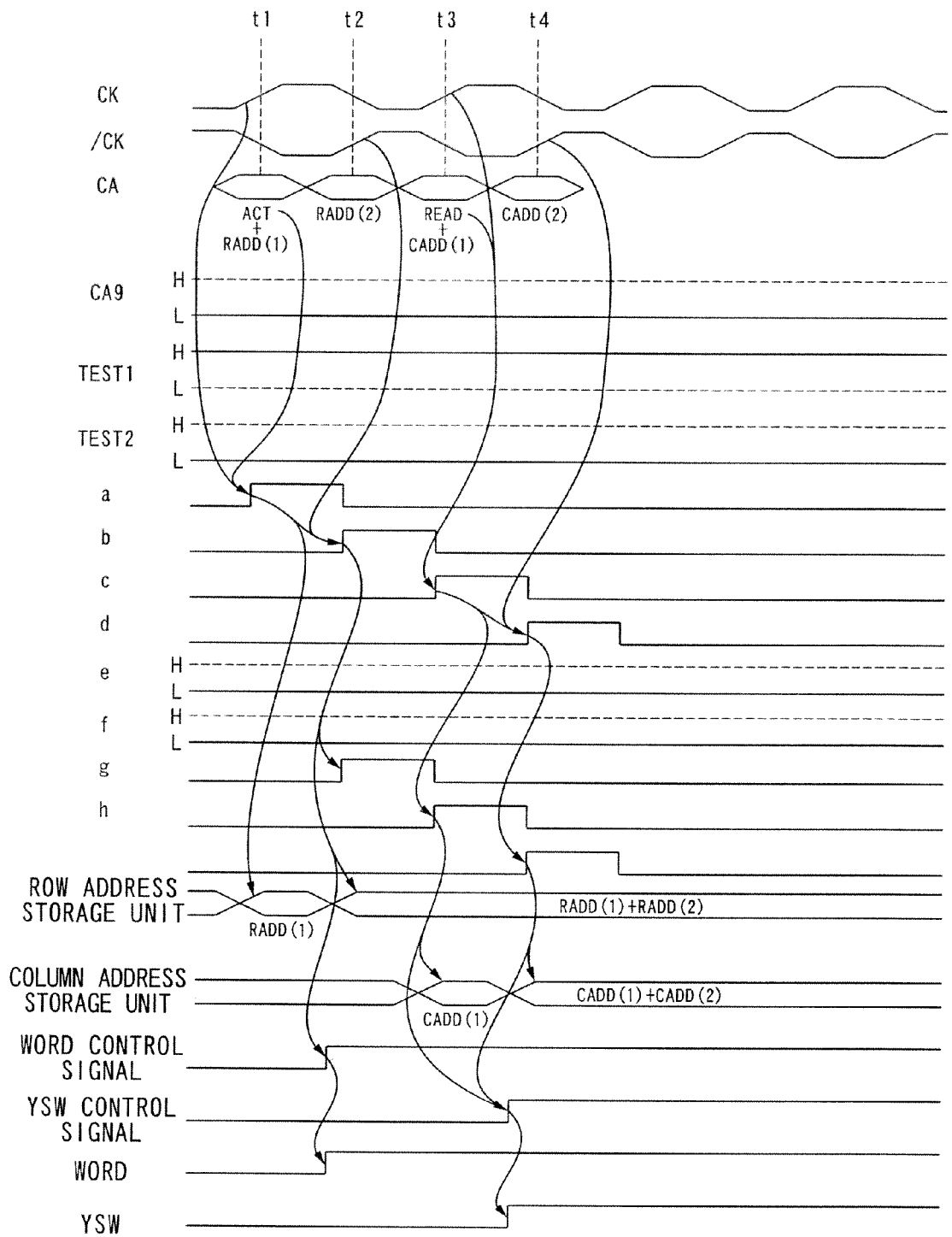
FIG. 6 is a timing chart illustrating operation in the general test mode of the semiconductor device of FIG. 5.
Figure 7:
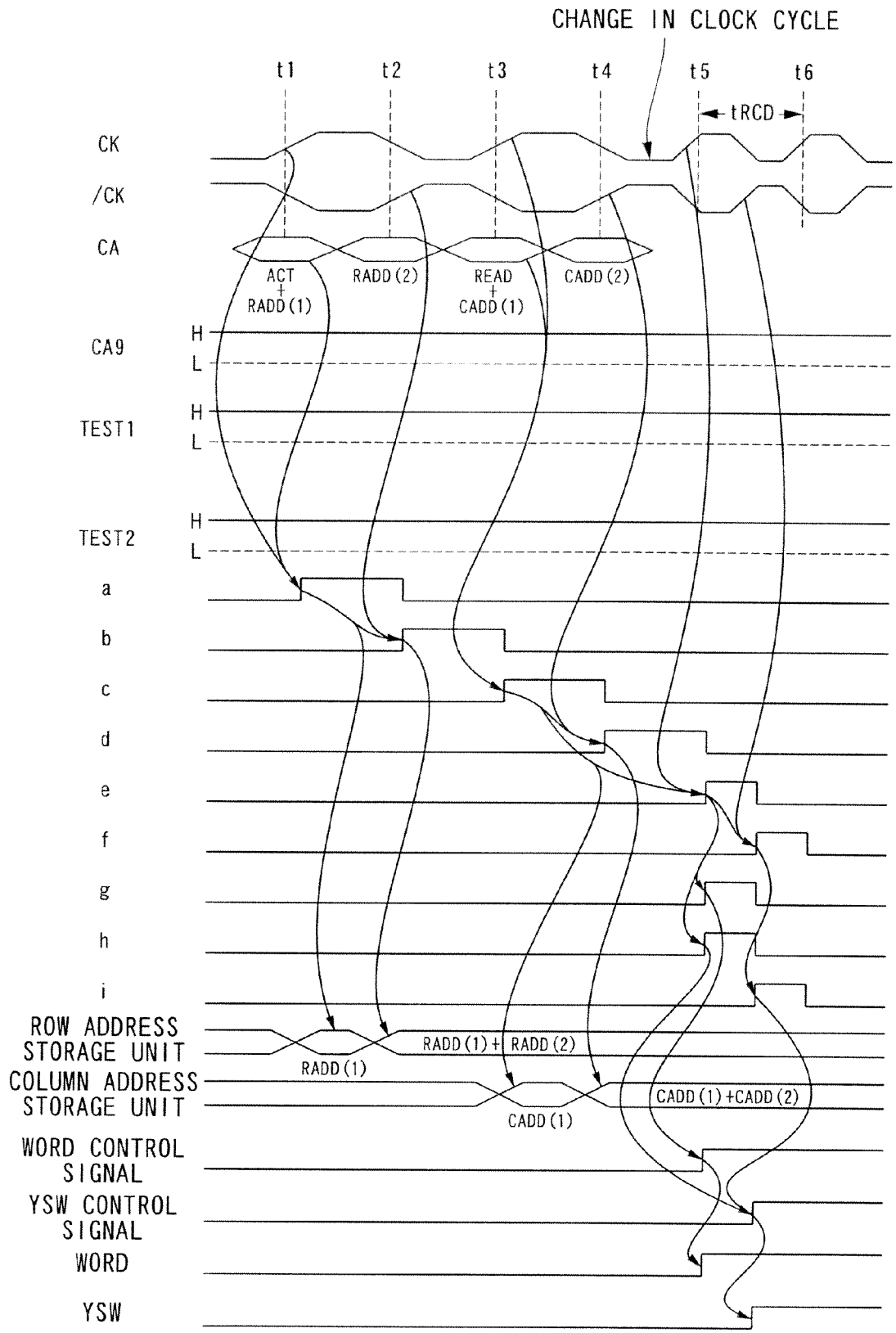
FIG. 7 is a timing chart illustrating operations in the internal operation separation test mode of the semiconductor device of FIG. 5.

FIGS. 6 and 7 are timing charts illustrating the operation of the semiconductor memory device 200 from the input of the ACT command to the output of the signal YSW in the test operation mode. FIG. 6 shows the operation in the general test mode, and FIG. 7 shows the operation in the internal operation separation test mode.

In the two test operation modes, similar to the test operation mode in the first embodiment, a plurality of semiconductor memory devices 200 is connected in parallel to the test device 300, and the common external clock CK, the common inverted external clock /CK, and the common command address input signal CA are input to the semiconductor memory devices 200.

In the general test mode shown in FIG. 6, since the unused address signal CA9, which is an input signal, is at an L level and the test signal TEST1 is at an H level, the AND circuit 150 outputs an L-level test signal TEST2. The semiconductor memory device 200 performs the same operation as that in the normal operation mode of the semiconductor memory device 100 according to the first embodiment. In the general test mode shown in FIG. 6, the semiconductor memory device 200 receives an external clock with the same period as that at the times t1 to t4 shown in FIG. 4 from the test device 300. At the times t1 to t4 shown in FIG. 6, the semiconductor memory device 200 receives an address input and a command input while increasing setup and hold time margins with respect to the external clock. Then, the semiconductor memory device 200 performs the same operation as that in the normal operation mode of the semiconductor memory device 100 according to the first embodiment, that is, a series of operations from the input of the ACT command to the output of the signal YSW.

In the internal operation separation test mode shown in FIG. 7, since the unused address signal CA9, which is an input signal, is at an H level and the test signal TEST1 is at an H level, the AND circuit 150 outputs an H-level test signal TEST2. Then, the semiconductor memory device 200 performs the same operation as that in the test operation mode of the semiconductor memory device 100 according to the first embodiment. At the times t1 to t4, the semiconductor memory device 200 receives an address input and a command input while increasing setup and hold time margins with respect to the external clock. At the times t5 and t6, the semiconductor memory device 200 performs the selection of the memory cell Cell by the word line and the selection of the column switch transistor N1 in synchronous with an external clock with a frequency that is higher than that of the external clock at the times t1 to t4. At the times t1 to t6 shown in FIG. 7, the semiconductor memory device 200 performs the same operation as that in the test operation mode of the semiconductor memory device 100 according to the first embodiment, that is, a series of operations from the input of the ACT command to the output of the signal YSW.

The semiconductor memory device (semiconductor memory device 200) according to this embodiment of the invention has the normal operation mode. In the normal operation mode, when the first command (ACT command) input from the outside is received, the first operation (the operation of selecting the word line) starts in synchronous with the clock signals (the external clock CK and the inverted external clock /CK) supplied from the outside. The semiconductor memory device also has the test operation mode. In the test operation mode, when the first command (ACT command) input from the outside is received, the first operation (the operation of selecting the word line) does not start. When the second command (READ command) input from the outside is received after the reception of the first command (ACT command), then the first operation (the operation of selecting the word line) starts in synchronous with the clock signals (the external clock CK and the inverted external clock /CK).

The semiconductor memory device (semiconductor memory device 200) according to this embodiment of the invention has the test operation mode, which is the first test operation mode, and the second test operation mode in which the same operation as that in the normal operation mode is performed during a test. The semiconductor memory device switches the normal operation mode and the first test operation mode or the second test operation mode according to the logic level of the first signal (test signal TEST1). The semiconductor memory device switches the first test operation mode and the second test operation mode according to the logic level of the second signal (unused address signal CA9) that can be input from the outside.

In this way, the semiconductor memory device 200 has the following effects while maintaining the effects of the first embodiment, which will be described with reference to FIG. 8.

Figure 8:
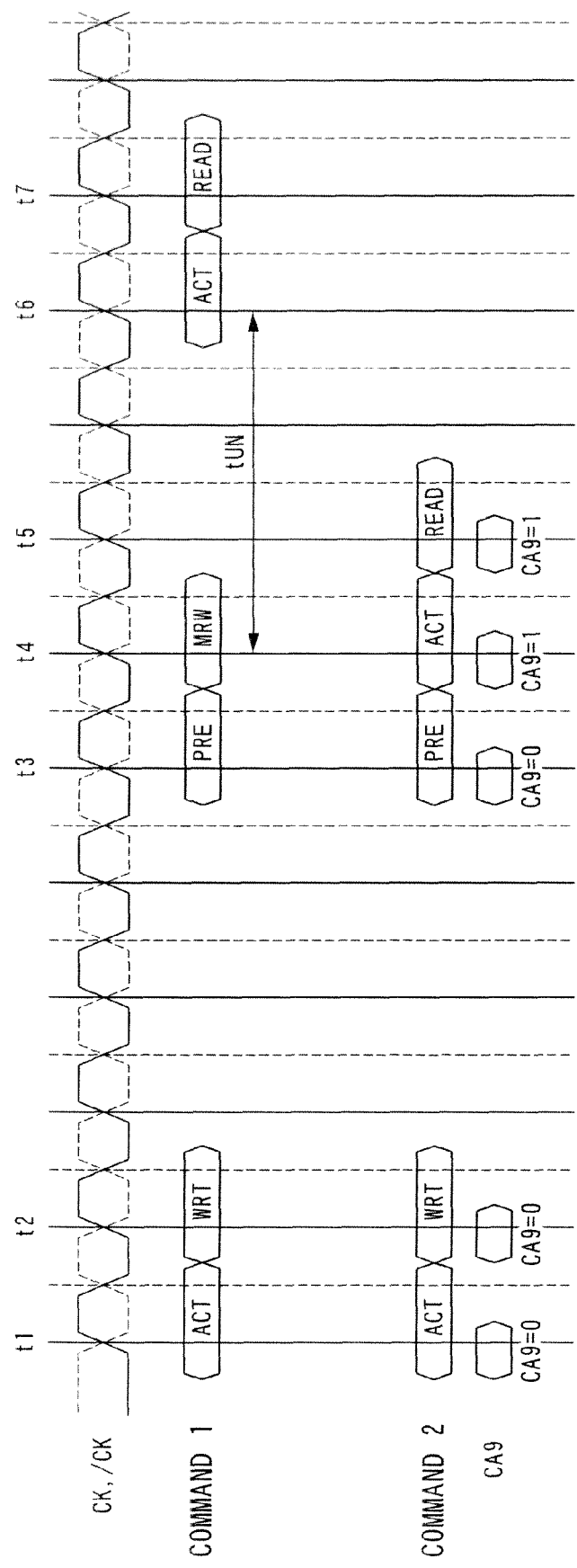
FIG. 8 is a timing chart illustrating test cycles of the semiconductor memory device of FIG. 1 and the semiconductor memory device of FIG. 5.

FIG. 8 is a timing chart illustrating the test cycles of the semiconductor memory device 100 according to the first embodiment and the semiconductor memory device 200 according to the second embodiment. FIG. 8 shows commands input in synchronous with the external clock. CK and the inverted external clock /CK that are input in time series. In FIG. 8, a command 1 indicates a command input to the semiconductor memory device 100 according to the first embodiment and a command 2 indicates a command input to the semiconductor memory device 200 according to the second embodiment. In FIG. 8, the logic level of the unused address signal CA9 input to the semiconductor memory device 200 is 0 (L level) or 1 (H level).

In FIG. 8, a WRT command indicates a write command, a PRE command indicates a precharge command, and an MRW command indicates a command required to change the logic level of the test signal TEST. In the semiconductor memory device 100, in order to change the logic level of the test signal TEST, it is necessary to input the MRW command after the PRE command is input.

During the test of the semiconductor memory device 100, the ACT command is input at a time t1 and the WRT command is input at a time t2 to perform a write operation. During the write operation, the operation (the selection of WORD and YSW) of the internal circuit is performed in synchronous with both the external command signal and the clock signal. The internal circuit is operated in the normal operation mode. Before data written to the memory cell Cell is read, the PRE command is input at a time t3 and the MRW command is input at a time t4. When the MRW command is input, the logic level of the test signal TEST is changed to an H level and the read operation of the internal circuit is performed in synchronous with the clock signal, not an external command signal.

After the MRW command is input, the ACT command is input at a time t6, and the READ command is input at a time t7. In this way, it is possible to perform the read operation in the test operation mode. In the semiconductor memory device 100, in order to change the test signal, it is necessary to input the MRW command whenever the operation is changed between the write operation and the read operation. The time corresponding to a time tUN shown in FIG. 8 is required whenever the operation is changed between the write operation and the read operation, which results in an increase in the test e.

During the test of the semiconductor memory device 200, instead of the test signal, the unused address signal CA9 is used for switching between the general test mode and the internal operation separation test mode. Therefore, it is possible to reduce the test time, as compared to the test of the semiconductor memory device 100.

In the command 2 shown in FIG. 8, when the ACT command, the WRT command, and the PRE command corresponding to the read operation are input (at the times t1, t2, and t3), the logic level of the unused address signal CA9 is 0 (L level). When the ACT command and the READ command corresponding to the read operation is input (at the times t4 and t5), the logic level of the unused address signal CA9 is 1 (H level).

In this way, during the test of the semiconductor memory device 200, in order to change the test signal, it is necessary to input the MRW command whenever the operation is changed between the write operation and the read operation. Therefore, in the semiconductor memory device 200, it is possible to further reduce the test time while maintaining the effects of the semiconductor memory device 100. As a result, it is possible to reduce test costs.

The term "configured" is used to describe a component, section or part of a device includes hardware and/or software that is constructed and/or programmed to carry out the desired function.

It is apparent that the present invention is not limited to the above embodiments, but may be modified and changed without departing from the scope and spirit of the invention.

What is claimed is:

1. A method of testing a semiconductor device, the method comprising:
   entering the semiconductor device in a test operation mode;
   supplying, in a state that the semiconductor device is being in the test operation mode, the semiconductor device with a test lock signal of a first frequency and changing the test clock signal from the first frequency to a second frequency that is greater than the first frequency; and
   supplying, in a state that the semiconductor device is receiving the test clock signal of the first frequency, a first command to the semiconductor device so that the semiconductor device fetches the first command in response to the test clock signal of the first frequency and performs a first operation based on the first command in response to the test clock signal of the second frequency.

2. The method as claimed in claim 1, wherein the semiconductor device includes a plurality of memory cells, the method further comprising supplying, in the state that the semiconductor device is receiving the test clock signal of the first frequency, an address information to the semiconductor device so that the semiconductor device fetches the address information in response to the test clock signal of the first frequency and performs the first operation on one or ones of the memory cells designated in response to the address information.

3. The method as claimed in claim 2, wherein the address information includes a plurality of information bits, and the first command and one or ones of the information bits of the address signal are supplied substantially simultaneously to the semiconductor device.

4. The method as claimed in claim 3, wherein the first command and the one or ones of the information bits of the address information are supplied to the semiconductor device in response to a first edge of the test clock signal of the first frequency, and remaining one or ones of the information bits of the address information are supplied to the semiconductor device in response to a second edge, that follows the first edge, of the test clock signal of the first frequency.

5. The method as claimed in claim 1, wherein the device comprises a plurality of memory cells and a plurality of word lines, each of the word lines is coupled to associated ones of the memory cells, and the semiconductor device performs the first operation to selectively activate one or ones of the word lines.

6. The method as claimed in claim 1, further comprising:
   releasing the semiconductor device from the test operation mode;
   entering the semiconductor device in another operation mode;
   supplying, during the semiconductor device being in the another operation mode, an external clock signal of a third frequency; and
   supplying, in a state that the semiconductor device is receiving the external clock signal of the third frequency, the first command to the semiconductor device so that the semiconductor device fetches the first command in response to the external clock signal of the third frequency and performs the first operation in response to the external clock signal of the third frequency.

7. A method of producing a tested semiconductor device, the method comprising:
  providing a semiconductor device; and
  testing the semiconductor device, the testing including:
    entering the semiconductor device in a test operation mode;
    supplying, in a state that the semiconductor device is being in the test operation mode, the semiconductor device with a test clock signal that has a first frequency;
    changing, in the state, the test clock signal from the first frequency to a second frequency that is greater than the first frequency;
    supplying, in the state, the test clock signal that has the second frequency; and
    inputting, in response to the test clock signal that has the first frequency, a first command into the semiconductor device, the first command indicating that the semiconductor device perform a first operation, and the semiconductor device performing, after the changing the frequency of the test clock signal, the first operation in response to the test clock signal that has the second frequency.

8. The method as claimed in claim 7, wherein providing the semiconductor device includes providing the semiconductor device that comprises a plurality of memory cells, and the testing further comprises inputting, in response to the test clock signal that has the first frequency, an address information into the semiconductor device, the address information designating one or ones of the memory cells.

9. The method as claimed in claim 8, wherein the address information includes a plurality of information bits, and the first command and one or ones of the information bits of the address information are inputted substantially simultaneously into the semiconductor device.

10. The method as claimed in claim 9, wherein the first command and the one or ones of the information bits of the address information are inputted into the semiconductor device in response o a first edge of the test clock signal that has the first frequency, and remaining one or ones of the information bits of the address information are inputted into the semiconductor device in response to a second edge, that follows he first edge of the test clock signal that has the first frequency.

11. The method as claimed in claim 7, wherein the providing the semiconductor device includes providing the semiconductor device that comprises a plurality of memory cells and a plurality of word lines, each of the word lines is coupled to associated ones of the memory cells, and the semiconductor device performs the first operation to selectively activate one or ones of the word lines.

12. The method as claimed in claim 7, wherein the testing further comprises:
  releasing the semiconductor device from the test operation mode;
  entering the semiconductor device in another operation mode;
  supplying, during the semiconductor device being in the another operation mode, an external clock signal that has a third frequency; and
  inputting, in response to the external clock signal that has the third frequency, the first command into the semiconductor device, the semiconductor device performing the first operation in response to the external clock signal that has the third frequency.

13. A method of producing a plurality of tested semiconductor devices, the method comprising:
  providing a plurality of semiconductor devices;
  coupling the plurality of semiconductor devices in common to a test apparatus; and
  testing the semiconductor devices, the testing including:
    commonly entering the semiconductor devices in a test operation mode;
    commonly supplying, in a state that the semiconductor devices are being in the test operation mode, the semiconductor devices with a test clock signal of a first frequency from the test apparatus and changing the test clock signal from the first frequency to a second frequency that is greater than the first frequency by the test apparatus; and
    commonly supplying, in a state that each of the semiconductor devices is receiving the test clock signal of the first frequency, a first command to the semiconductor devices from the test apparatus so that each of the semiconductor devices fetches the first command in response to the test clock signal of the first frequency and performs a first operation based on the first command in response to the test clock signal of the second frequency.

14. The method as claimed in claim 13, wherein the providing the semiconductor devices includes providing the semiconductor devices each of which comprises a plurality of memory cells, and the testing further comprises commonly supplying, in the state that each of the semiconductor devices are in common receiving the test clock signal of the first frequency, an address information from the test apparatus to the semiconductor devices so that each of the semiconductor device fetches the address information in response to the test clock signal of the first frequency and performs the first operation on one or ones of the memory cells designated in response to the address information.

15. The method as claimed in claim 14, wherein the address information includes a plurality of information bits, and the first command and one or ones of the information hits of the address information are commonly substantially simultaneously supplied to the semiconductor devices.

16. The method as claimed in claim 15, wherein the first command and the one or ones of the information bits of the address information are commonly supplied to the semiconductor devices n response to a first edge of the test clock signal of the first frequency, and remaining one or ones of the information bits of the address information are commonly inputted into the semiconductor devices in response to a second edge, that follows the first edge, of the test clock signal of the first frequency.

17. The method as claimed in claim 13, wherein the providing the semiconductor devices includes providing the semiconductor devices each of which comprises a plurality of memory cells and a plurality of word lines, each of the word lines of each of the semiconductor devices is coupled to associated ones of the memory cells of the each of the semiconductor devices, and each of the semiconductor devices performs the first operation to selectively activate one or ones of the word lines thereof.

18. The method as claimed in claim 13, wherein the testing further comprises:
  releasing the semiconductor devices from the test operation mode;
  entering the semiconductor devices in another operation mode;
  commonly supplying, when each of the semiconductor device is in the another operation mode, an external clock signal of a third frequency from the test apparatus; and commonly inputting, in a state that each of the semiconductor devices is receiving the external clock signal of the third frequency, the first command to the semiconductor device from the test apparatus so that each of the semiconductor devices fetches the first command in response to the external clock signal of the third frequency and performs the first operation in response to the external clock signal of the third frequency.

* * * * *

UNITED STATES PATENT AND TRADEMARK OFFICE
CERTIFICATE OF CORRECTION

PATENT NO. : 8,310,890 B2
APPLICATION NO. : 13/422978
DATED : November 13, 2012
INVENTOR(S) : Akiyoshi Yamamoto It is certified that error appears in the above-identified patent and that said Letters Patent is hereby corrected as shown below:

Col. 19, line 4, claim 10, replace "device in response o a first edge of the test clock signal that" with --device in response to a first edge of the test clock signal that--

Col. 20, line 3, claim 15, replace "first command and one or ones of the information hits of the" with --first command and one or ones of the information bits of the--; and Col. 20, lines 3-4, claim 16, replace "semiconductor devices n response to a first edge of the test clock signal" with --semiconductor devices in response to a first edge of the test clock signal--

Signed and Sealed this
Twenty-second Day of January, 2013

David J. Kappos
*Director of the United States Patent and Trademark Office*

UNITED STATES PATENT AND TRADEMARK OFFICE
CERTIFICATE OF CORRECTION

PATENT NO. : 8,310,890 B2
APPLICATION NO. : 13/422978
DATED : November 13, 2012
INVENTOR(S) : Akiyoshi Yamamoto Page 1 of 1

It is certified that error appears in the above-identified patent and that said Letters Patent is hereby corrected as shown below:

Column 19, line 39 (Claim 10, line 3), replace "device in response o a first edge of the test clock signal that" with --device in response to a first edge of the test clock signal that--;

Column 20, line 37 (Claim 15, line 3), replace "first command and one or ones of the information hits of the" with --first command and one or ones of the information bits of the--; and Column 20, lines 42-43 (Claim 16, lines 3-4), replace "semiconductor devices n response to a first edge of the test clock signal" with --semiconductor devices in response to a first edge of the test clock signal--.

This certificate supersedes the Certificate of Correction issued January 22, 2013.

Signed and Sealed this
Nineteenth Day of February, 2013

Teresa Stanek Rea
*Acting Director of the United States Patent and Trademark Office*